(12) United States Patent
Hochstrat et al.

(10) Patent No.: US 7,719,883 B2
(45) Date of Patent: May 18, 2010

(54) MAGNETORESISTIVE ELEMENT, PARTICULARLY MEMORY ELEMENT OR LOGIC ELEMENT, AND METHOD FOR WRITING INFORMATION TO SUCH AN ELEMENT

(75) Inventors: Andreas Hochstrat, Voerde (DE); Xi Chen, Guangzhou (CN); Pavel Borisov, Duisburg (DE); Wolfgang Kleemann, Duisburg (DE)

(73) Assignee: Universitat Duisburh-Essen, Essen (DE)

( * ) Notice: Subject to any disclaimer, the term of this patent is extended or adjusted under 35 U.S.C. 154(b) by 16 days.

(21) Appl. No.: 11/909,854

(22) PCT Filed: Mar. 30, 2006

(86) PCT No.: PCT/EP2006/002892

§ 371 (c)(1),
(2), (4) Date: May 5, 2008

(87) PCT Pub. No.: WO2006/103065

PCT Pub. Date: Oct. 5, 2006

(65) Prior Publication Data
US 2009/0067224 A1    Mar. 12, 2009

(30) Foreign Application Priority Data

| Mar. 30, 2005 | (DE) | ........................ 10 2005 014 820 |
| Apr. 1, 2005 | (DE) | ........................ 10 2005 015 339 |
| Sep. 12, 2005 | (DE) | ........................ 10 2005 043 574 |

(51) Int. Cl.
*G11C 11/00* (2006.01)

(52) U.S. Cl. .................. 365/158; 365/170; 365/173
(58) Field of Classification Search ................. 365/158, 365/170, 173
See application file for complete search history.

(56) References Cited

U.S. PATENT DOCUMENTS

| 5,574,605 | A | 11/1996 | Baumgart et al. |
| 6,483,741 | B1 * | 11/2002 | Iwasaki et al. ............... 365/170 |
| 6,673,675 | B2 * | 1/2004 | Yates et al. .................. 438/257 |
| 6,917,087 | B2 * | 7/2005 | Chen .......................... 257/421 |
| 7,193,285 | B2 * | 3/2007 | Chen .......................... 257/421 |
| 7,345,475 | B2 * | 3/2008 | Takeuchi et al. ............. 324/249 |

(Continued)

FOREIGN PATENT DOCUMENTS

WO        03/075290        9/2003

(Continued)

OTHER PUBLICATIONS

Berkowitz et al., "Exchange anistotropy—a review", Journal of Magnetism and Magnetic Materials 200, 1999, p. 552-570.

(Continued)

*Primary Examiner*—Gene N. Auduong
(74) *Attorney, Agent, or Firm*—Jason H. Vick; Sheridan Ross, P.C.

(57) ABSTRACT

A magnetoresistive element, in particular a memory element or a logic element and a method for writing information to such an element are disclosed. The element comprises a first contact of ferromagnetic material and a corresponding layer of magnetoelectric or ferromagnetic material, whereby the first contact is magnetically polarized, depending on an antiferromagnetic boundary surface polarization of the first layer. Said magnetic polarization forms binary information.

24 Claims, 3 Drawing Sheets

U.S. PATENT DOCUMENTS 7,573,734 B2 * 8/2009 Grino et al. ................. 365/145

FOREIGN PATENT DOCUMENTS

WO 2004/032145 4/2004

OTHER PUBLICATIONS

Bichurin et al. "Resonance magnetoelectric effects in layered magnetostrictive-piezoelectric composites", Physical Review B 68, 132408, 2003, pp. 132408-1 to 132408-4.

Cai et al., "Dielectric, ferroelectric, magnetic and magnetoelectric properties of multiferroic laminated composites." Physical Review B 68, 224103, Dec. 2003, pp. 224103-1 to 224103-7.

Ederer et al. "Weak ferromagnetism and magnetoelectric coupling in bismuth ferrite", Physical Review B 71, 060401 (R), Feb. 2005, pp. 060401-1 to 060401-4.

Kuramochi et al. "Nano-oxide fabrication on thin-films of 3d-metal compounds and alloys", Surface Science 566-568, 2004, p. 349-355.

Spaldin et al., "Computational design of multifunctional materials", Journal of Solid State Chemistry 176, Dec. 2003, p. 615-632.

Zhan et al. "Influence of mechanical boundary conditions and microstructural features on magnetoelectric behavior in a three-phase multiferroic particulate composite." Physical Review B 70, 1334417, Oct. 2004, pp. 134417-1 to 134417-6.

International Search Report (including translation) for International (PCT) Application No. PCT/EP2006/002892, mailed Jun. 21, 2006, 4 pages.

Written Opinion (including translation) for International (PCT) Application No. PCT/EP2006/002892, mailed Jun. 21, 2006, 4 pages.

International Preliminary Report on Patentability (including translation) for International (PCT) Application No. PCT/EP2006/002892, Issued Oct. 3, 2007, 6 pages.

* cited by examiner

MAGNETORESISTIVE ELEMENT, PARTICULARLY MEMORY ELEMENT OR LOGIC ELEMENT, AND METHOD FOR WRITING INFORMATION TO SUCH AN ELEMENT

The present invention relates to a magnetoresistive element, particularly a memory element or logic element, a layout formed thereof, a method for writing information to such an element, as well as a use of an exchange bias system for the storage of information.

Magnetoelectronics and the spin-polarized transport of charge carriers have undergone rapid development in recent years. This development was triggered primarily by the discovery of the so-called giant magnetoresistance (GMR) and the tunnel magnetoresistance (TMR). These two effects made it possible for the first time to convert a magnetic field or magnetization information directly into a resistance change. Both effects are based on the transport of spin-polarized electrons between two ferromagnetic contacts, with the relative magnetization of the two contacts being crucial for the resistance of the overall component. The two contacts or other layers, whose magnetic moments are oriented relative to each other and influence the magnetization hysteresis, are also referred to as an exchange bias system. The GMR is usually used in purely metallic structures and the TMR in structures with an oxidic tunnel barrier between two ferromagnetic metal layers. Currently, TMR structures are used for electronically readable magnetic memories (MRAMs), whereas the GMR is used commercially primarily in magnetic field sensing technology and in hard disk reading heads. The present invention relates particularly to such a magnetoresistive or other element in which at least one piece of information is present or is storable in magnetic form.

In today's MRAM or an MROM as set forth in WO 2004/032145 A2, the writing of information—i.e. magnetic polarization or magnetization—usually takes place by means of a corresponding field of magnetization which is produced electromagnetically. The polarity of the magnetic field is varied depending on the information. A disadvantage or problem here is that a focusing of the magnetic field is difficult or expensive with respect to a high packing density and that relatively high electric currents are required to produce and vary the magnetic field during writing and lead to a large amount of undesired heat loss.

U.S. Pat. No. 6,483,741 B1 relates to the remagnetization of a material with magnetic anisotropy, for example in an MRAM, through application of a magnetic pulse or a driving force transversely to the original direction of magnetization. The pulse or the driving force is produced either through the piezoelectric effect or by varying the interaction of the material with another magnetic material via a control layer.

It is the object of the present invention to propose an improved magnetoresistive element, a layout formed thereof, an improved method for writing information to a particularly magnetoresistive element, as well as a use of an exchange bias system for the storage of information, particularly wherein an at least substantially currentless writing of a piece of magnetic, preferably non-volatile information is possible.

The abovementioned object is achieved by a magnetoresistive element as set forth in claim 1, by a layout as set forth in claim 8, by a method as set forth in claim 9 or 10, or through a use as set forth in claim 15. Advantageous modifications are the subject of the subordinate claims.

The magnetoresistive element preferably has two ferromagnetic contacts connected via a separating layer which particularly form a TMR element or GMR element. A first layer of magnetoelectric or ferroelectric material is allocated to the first contact [such] that the first contact is magnetically polarizable depending on the antiferromagnetic boundary surface polarization of the first layer. The first contact and the first layer form an exchange bias system. Using an electric field—in the case of magnetoelectric material together with a magnetic field—the antiferromagnetic boundary surface polarization, i.e. the orientation of the magnetic moments or spins of the first layer at least in the boundary layer, can be steered toward the first contact. In particular, a variation of the electric field is sufficient to vary the information during writing; the magnetic field additionally required with magnetoelectric material, in contrast to conventional methods, can be kept constant even while writing varied information, and can therefore be produced by a permanent magnet, for example. As a result, the magnetic polarization of the first contact is determined or controlled by the electric field and not by an electric current. The magnetic polarization or magnetization of the first contact then forms stored information of the magnetoresistive element. The electric resistance via the two contacts allows this information to be read, since the electric resistance is low with a parallel orientation of the polarizations or magnetic moments of the two contacts and high with antiparallel (opposing) orientation.

The preferred method for writing information is characterized in that the magnetoelectric layer is heated over a critical temperature and antiferromagnetically polarized or manupulated by means of a magnetic field and an electric field in a desired manner in its boundary layer, with the magnetic field and the electric field being maintained until cooling below the critical temperature or until freezing of the antiferromagnetic boundary surface polarization of the magnetoelectric layer determined by the magnetic field and the electric field, so that the allocated contact is magnetically polarized by the antiferromagnetic boundary surface polarization in a desired manner and this magnetic polarization forms a magnetic piece of information of the element. Through appropriate antiferromagnetic boundary surface polarization of the layer, the writing of the information is thereby accomplished.

Advantageously, during the writing of information, the same polarization of the magnetic field can always be used, with the antiferromagnetic boundary surface polarization of the layer or the information depending on the direction of the electric field relative to the magnetic field—parallel or antiparallel. Accordingly, the magnetic field can be produced for the antiferromagnetic boundary surface polarization of the layer particularly by a permanent magnet. Moreover, the writing can take place substantially without current, since only an electric field is required to establish the antiferromagnetic boundary surface polarization of the layer.

Further advantages, features, characteristics and aspects of the present invention follow from the claims and the following description of preferred sample embodiments of the drawing.

In the figures, the same reference symbols are used for same or similar parts, with corresponding or comparable characteristics and advantages being achieved even if a repeated description is omitted particularly for purposes of simplification.

Figure 1:
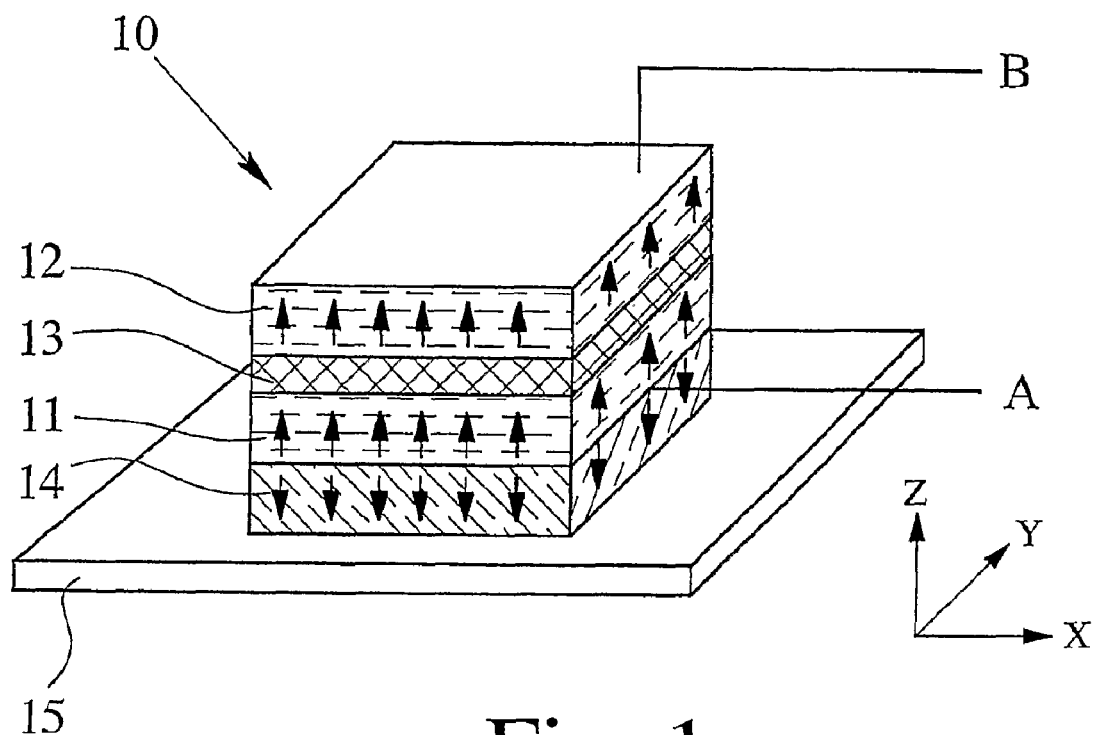
FIG. 1 shows a schematic layout of a proposed magnetoresistive element according to a first form of embodiment.
Figure 2:
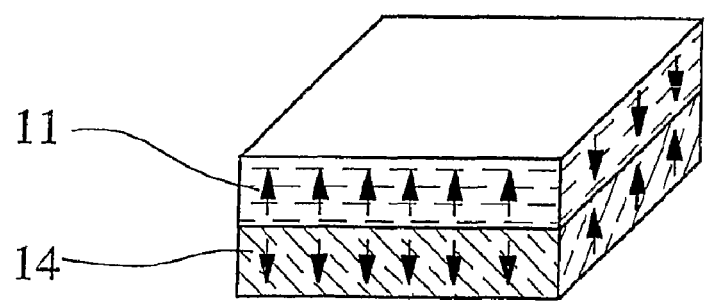
FIG. 2 shows a first contact and a first layer of the magnetoresistive element which form a proposed exchange bias system.

FIG. 1 shows, in a merely schematic, not to-scale illustration, a proposed magnetoresistive element 10 with a first contact 11 and a second contact 12, which are connected electrically to each other via an interposed separating layer or barrier 13.

The first contact 11 and the second contact 12 are preferably constructed of ferromagnetic material, are hence ferromagnetic, and particularly form a TMR element or GMR element whose electrical resistance between A and B depends on the relative orientation of the magnetic moments or polarizations of the two contacts 11, 12 indicated by arrows. The separating layer 13 forms, accordingly, a tunnel barrier or an electrically conductive, optionally metallic connection.

A first layer 14 of magnetoelectric or ferroelectric material is allocated, particularly adjacently, to the first contact 11. Preferably, the first contact 11 and the first layer 14 lie on each other over their entire surfaces. The first contact 11 and the first layer 14 form a proposed exchange bias system. This means that the magnetic moments of the first contact 11 and the first layer 14 correlate in their orientations, particularly running antiparallel. An orientation of the magnetic moments or polarization of the first contact 11 occurs particularly as a result of this interaction depending on the antiferromagnetic boundary surface polarization of the first layer 14.

In the first embodiment according to FIG. 1, the magnetoresistive element 10 has a second layer 15 which, in the depicted example, is immediately adjacent to the first layer 14, specifically on the flat side facing away from the first contact 11. In the first embodiment, the second layer 15 is constructed of permanently magnetic material, is hence permanently magnetic, and/or as a pad electrode.

It should be noted with respect to the magnetoresistive element 10 that FIG. 1, in particular, is merely to be understood as a schematic section of a particularly laminar or plate-like layout or the like and merely serves to explain the function, in particular, of a memory cell. Particularly, a magnetic memory or the like can have a plurality of such elements 10 or memory cells preferably arranged next to each other, particularly on a plane, with corresponding or similar layering.

For example, the separating layer 13, the first layer 14 and/or the second layer 15 can be designed as continuous layers, free of interruptions as necessary. As needed, the first contact 11 and the second contact 12 can also be designed as continuous layers or the like.

Alternatively, particularly the first contact 11 and the second contact 12 or, in the case of the second form of embodiment, the pad electrodes 16, 17, can also be designed to be flat but not continuous, but rather form strips or the like running transversely to each other on different planes in order to facilitate the addressing of individual memory cells. FIG. 1 merely depicts a single memory cell which is preferably constructed in the z-direction perpendicular to the xy-plane of the strips (not shown) or other laminar extension of the first and second contact 11, 12 or the layers 13 to 15. However, other layouts and structures are also possible.

The arrangement of the first contact or surface area 11 and the first layer 14 indicated in FIG. 1 forms a proposed exchange bias system in which the magnetic moments of the first contact 11 and the first layer 14 are preferably oriented antiparallel to each other, for example away from each other as depicted, or toward each other, or parallel to the main planes of the layers.

According to the proposal, however, purely antiferromagnetic material is not used for the first layer 14—as is common and proposed in U.S. Pat. No. 6,483,741 B1—but rather preferably magnetoelectric material, particularly $Cr_2O_3$. The "magnetoelectric" characteristic consists in that, in the first layer 14, the orientation of the magnetic moments or spins in the boundary layer on the boundary surface toward the first contact 11 can be preset by an outer magnetic field and an electric field and, particularly, can be established permanently. This is also referred to in the present invention as antiferromagnetic boundary surface polarization (AGP). Particularly, the "magnetoelectric" characteristic of the present invention is understood in terms of the article "Revival of the magnetoelectric effect" by Manfred Fiebig, J. Phys. D: Appl. Phys. 38 (2005), R123-R152, which is introduced here as a supplementary disclosure.

The direction of the AGP can be preset, i.e. is controllable, through the magnetic field and outer electric field. Moreover, the AGP remains intact even after shutting off the magnetic field and the electric field.

Figure 3:
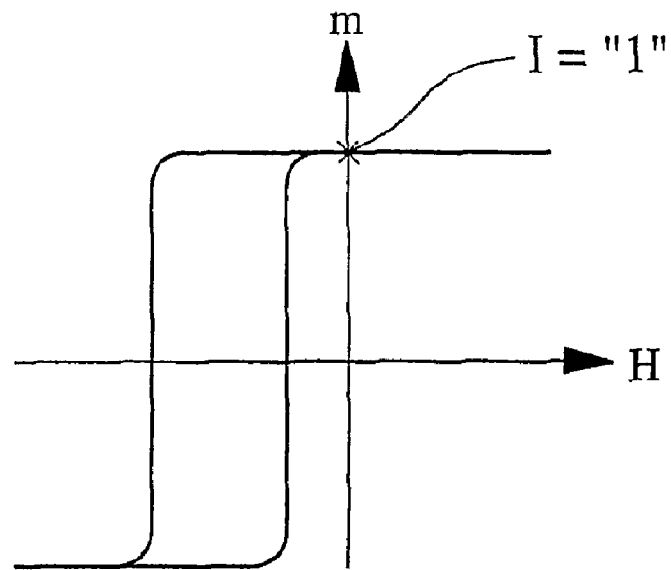
FIG. 3 shows a diagram which shows a state of magnetization of the exchange bias system or of the first contact.
Figure 4:
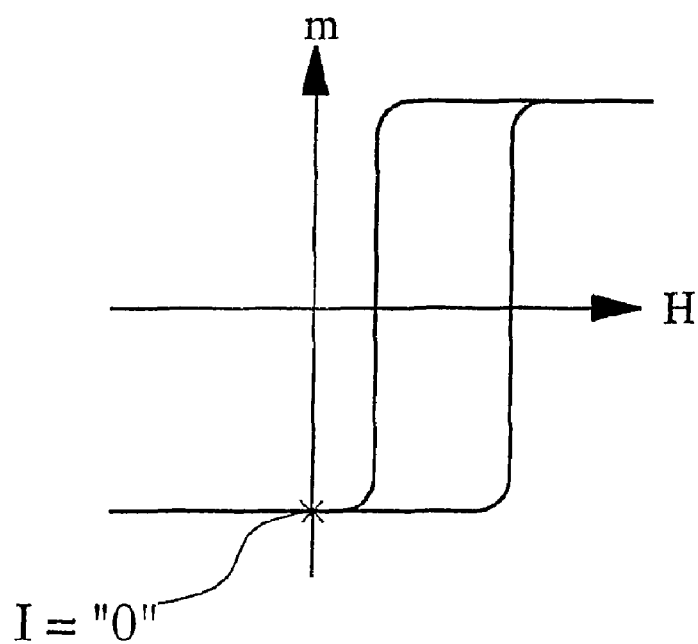
FIG. 4 shows a diagram which shows another state of magnetization of the exchange bias system or of the first contact.

The preset AGP of the magnetoelectric layer 14 leads to a defined, particularly an opposed or parallel magnetic, polarization of the first contact 11. Accordingly, the direction of polarization of the first contact 11 is controlled by the direction of the AGP. FIG. 3 shows a diagram which shows, very schematically, the magnetization hysteresis of the first contact 11 with AGP of the first layer 14 in a first direction. FIG. 4 shows the corresponding schematic magnetization hysteresis with opposite AGP of the first layer 14. The x-axis indicates the respective outer magnetic field H here. The y-axis corresponds to the magnetic moment m of the first contact 11.

Both diagrams illustrate that the magnetoelectric layer 14 leads to a pronounced assymmetry or shift of the magnetization hystereses depending on the direction of the AGP of the layer 14. Particularly, it becomes clear that, without an outer magnetic field—i.e. where H=0—the magnetic polarization of the first contact 11 is clear. This magnetic polarization or magnetization of the first contact 11 can therefore be understood as information I which merely depends on the AGP of the first layer 14. In the case of FIG. 3, the information I is "1" or "high," for example, and in the case of FIG. 4 it is "0" or "low," for example.

In order to magnetize the magnetoelectric layer 14—that is, to write the information I—the magnetoelectric layer 14 is preferably heated over a critical temperature T (in the case of $Cr_2O_3$, about 310 K) and "polarized" by an outer magnetic field (which can be produced by the second layer 15) and electric field in the desired manner at least in its boundary layer toward the first contact 11 in order to achieve the desired AGP. Here, the product of the field intensities of the magnetic field and the electric field must exceed a minimum value M and the magnetoelectric layer 14 must be heated over the temperature T. The outer magnetic field and the outer electric field preferably remain on until the magnetoelectric layer 14 has cooled again to below the temperature T and hence the desired AGP is set or "frozen." Alternatively, this writing or copying or setting of the AGP and hence of information can also occur without heating—particularly at room temperature—if the product of magnetic field and electrical field is sufficiently large.

Figure 5:
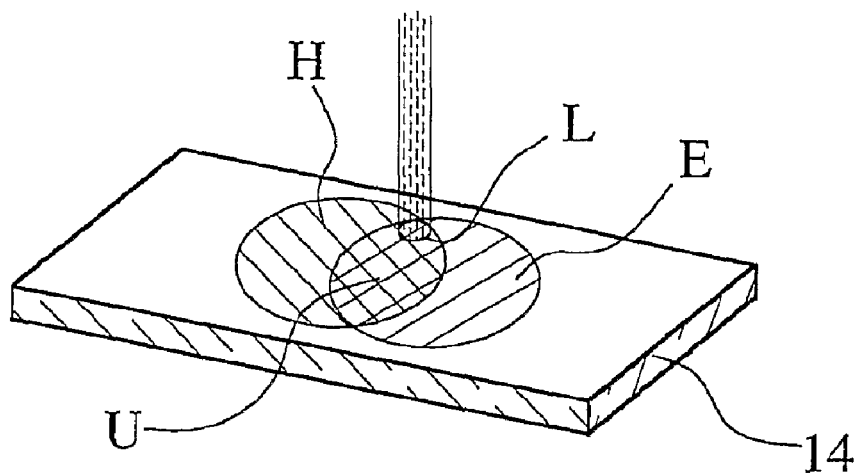
FIG. 5 shows a schematic field distribution during writing of information.

In order to make a high storage density possible, a spatially very limited AGP of the magnetoelectric layer 14 is desirable, as indicated in FIG. 5. The limiting of the AGP to a desired area which is as small as possible allows for a correspondingly dense packing of memory cells. To be able to antiferromagnetically polarize as small an area as possible, the following two measures are proposed, which can be implemented alternatively or together:

a) The heating preferably occurs by means of radiation, particularly light, preferably laser light L of a laser. This is relatively easy to implement, for example through a movable laser head such as in a DVD burner or the like. The heating by laser light L can take place very quickly and, particularly, limited very locally. Accordingly, the area in which the AGP is set or can be set in the magnetoelectric layer 14 can also be limited through the local heating.

b) The outer magnetic field H and the outer electric field E are produced, for example, by a magnetic head and an electrode tip. The maximum field intensity of the magnetic field H lies in a first area of the magnetoelectric layer 14 and the maximum field intensity of the electric field E in a second area of the magnetoelectric layer 14 spaced apart from the first. Only in an overlapping area Ü of the magnetic field H and of the electric field E which depends on the field intensities and the spacing does the product of the field intensities of the magnetic field H and the electric field E exceed the minimum value M required for the AGP of the magnetoelectric layer 14—i.e. the intensity required to write the desired information. Accordingly, the possible AGP area is limited to this overlapping area Ü. By varying the spacing and/or the field intensities, the size of the overlapping area Ü can be adapted as needed.

The two aforementioned measures can be combined in that the overlapping area Ü named under b) is heated only partially to or above the required or critical temperature T, so that the AGP of the magnetoelectric layer 14 and hence the writing of the magnetic information ultimately occurs only in this partial area.

It should also be noted regarding the proposed method that, for the AGP of the magnetoelectric layer 14, always the same polarization of the magnetic field can be and is preferably used independently of the desired direction of the AGP or of the information, since the direction of the AGP of the magnetoelectric layer 14 only depends on whether the magnetic field and the electric field are oriented parallel or antiparallel to each other. Accordingly, the direction of the AGP of the magnetoelectric layer 14 is preferably modulated, and the desired information thereby produced, only through variation of the direction of the electric field.

Preferably, the outer magnetic field H and the outer electric field E are at least substantially perpendicular to the plane of the magnetoelectric layer 14 during writing.

Particularly, the same magnetic field is always used during writing. Preferably, a permanent magnet can be used for this.

One special advantage lies in that, in contrast to previous magnetoresistive elements, a repolarization or a changing magnetic field depending on the information to be written is not necessary. This simplifies the proposed method considerably, so that the use of an electromagnet is less problematic and, in particular, even a permanent magnet can be used.

Another advantage lies in that no substantial current need flow in order to write. Rather, the application of the electric field is sufficient for writing. In addition, the actual fixation can occur through the preferably only local heating and cooling of the magnetoelectric layer 14.

In the following, two preferred embodiments of the proposed magnetoresistive element 10 are explained in more detail. The two sample embodiments are oriented toward magnetoresistive reading or recovery of information. In principle, however, reading can also take place in another manner.

In the first embodiment of the magnetoresistive element or memory element 10 depicted in FIG. 1, the electrical resistance over the two contacts 11 and 12 and the separating layer 13 disposed between them—i.e. between the schematically indicated contacts A and B—depends on the relative orientation of the magnetic moments in the two contacts 11 and 12, as already explained.

In the first form of embodiment, the orientation of the magnetic moments of the second contact 12 is preferably determined by the second layer 15 designed as a permanent magnet. Consequently, in the first embodiment, the abovementioned electrical resistance only depends on the orientation of the magnetic moments, i.e. on the magnetic polarization, of the first contact 11. Since, as already explained above on the basis of FIGS. 2 to 5, this polarization is in turn determined by the first, particularly magnetoelectric, layer 14, the stored information can hence be detected and "read" by measuring the abovementioned electrical resistance.

For the writing of the information—i.e. the desired magnetization of the magnetoelectric layer 14—the second layer 15 or another magnet preferably provides the outer magnetic field. Through application of an appropriate current, particularly between contact A and the second layer 15, the writing can occur in the desired manner, under appropriate additional heating as needed.

The magnetoresistive element 10 according to the first embodiment is particularly suitable for a RAM (random access memory) with a plurality of memory cells in a compact space.

According to a modified embodiment, the first and/or second layer 14, 15 is or are made substantially of $Cr_2O_3$.

According to another modified embodiment, the first and/or second layer 14, 15 is or are not constructed from magnetoelectric material, but rather at least substantially from so-called ferroelectric material which, according to the invention, preferably also is or includes multiferroic material, particularly $BaTiO_3$—$CoFe_2O_4$ nanostructures as published, for example, in the article "Multiferroic $BaTiO_3$—$CoFe_2O_4$ Nanostructures" by H. Zhieng et al., Science, Vol. 303, page 661 f. of Jan. 30, 2004. The multiferroic or ferroelectric characteristic of the layer 14 consists and results in the AGP being at least substantially modifiable and settable through an electric field, so that an additional outer magnetic field is not necessary. Heating over a critical temperature is also not necessary. The writing of information is thus simplified.

It should be noted that the second layer 15, as needed, can also not be permanently magnetic. For example, the second layer 15 can be constructed from antiferromagnetic material or constructed like the first layer 14.

Moreover, the second layer 15 can also be disposed directly on the allocated second contact 12.

Figure 6:
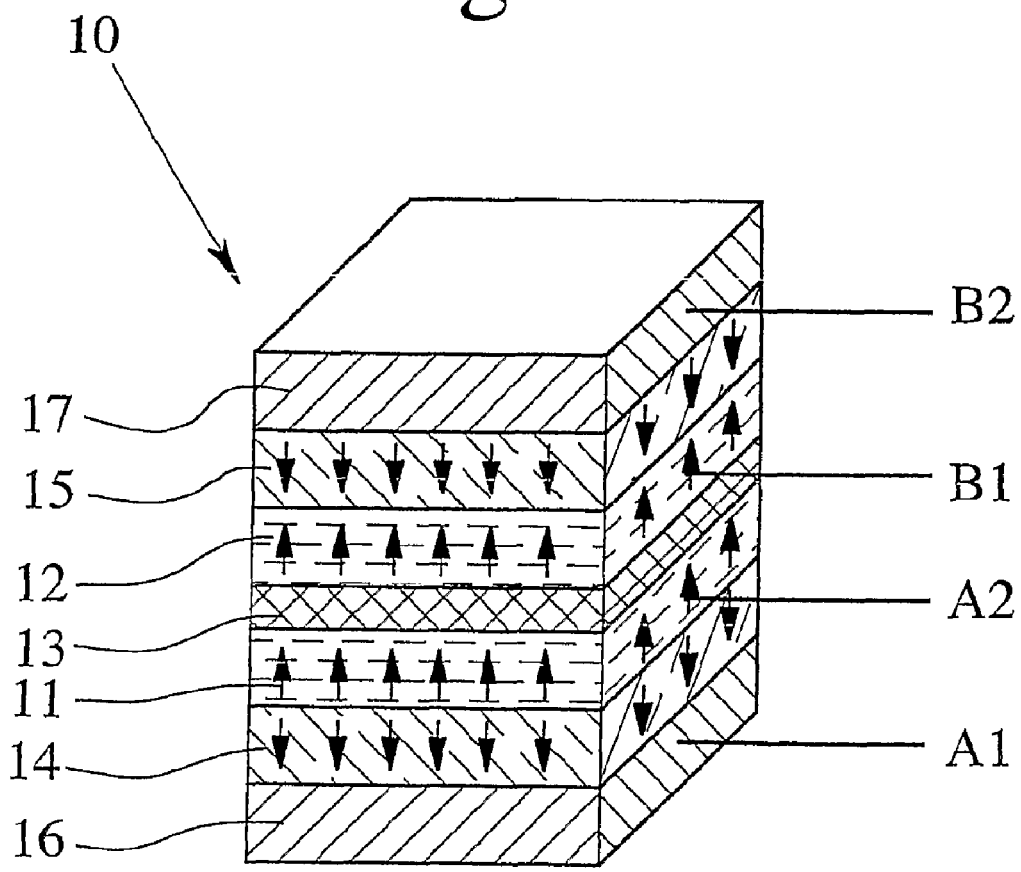
FIG. 6 shows a schematic layout of a proposed magnetoresistive element according to a second form of embodiment.

FIG. 6 shows a second form of embodiment of the magnetoresistive element 10 in a merely schematic, not-to-scale illustration similar to FIG. 1. The fundamental layout is similar, so in the following only essential differences vis-à-vis the first embodiment will be dealt with in detail. The foregoing explanations apply to the second embodiment accordingly. Particularly, any combination of various aspects of the two forms of embodiment is also possible.

In the second embodiment, the second layer 15 is disposed immediately adjacent to the second contact 12 on the flat side of the second contact 12 facing away from the separating layer 13. The second layer 12 is not permanently magnetic, but rather is constructed of magnetoelectric or ferroelectric material, particularly corresponding to the first layer 14. Consequently, the second contact 12 and the second layer 15 form an exchange bias system corresponding to or similar to the first contact 11 and the first layer 14.

Preferably, a provision is made that the first and/or second layer 14, 15 is or are provided with a pad electrode 16, 17 or forms or form same.

By means of the first and second layer 14, 15, the orientations of the magnetic moments of the first contact 11 on the one hand and of the second contact 12 on the other hand can be adjusted independently. Accordingly, a reversal of the stored information can occur by changing an orientation.

The magnetoresistive element 10 according to the second embodiment can, however, be used not only as a memory cell, but in particular as a logical element or gate with the binary Boolean function XOR (exclusive Or) as well.

If the magnetoresistive element 10 according to the second embodiment (made of magnetoelectric material in layers 14, 15) is subjected to an outer magnetic field H in the direction of layering, then the antiferromagnetic boundary surface polarizations of the two layers 14 and 15 can be set in the desired manner or direction independently of each other through the application of electric fields, particularly through the application of appropriate voltages between the contacts A1 and A2 or B1 and B2—if necessary, during the cooling to below the critical temperature T. The orientations of the magnetic moments of the two contacts 11 and 12 are hence set accordingly. Finally, the electrical resistance, which can be measured, for example, via the contacts A1 and B2, then depends on the relative orientation of the magnetic orientation or polarization of the two contacts 11 and 12 to each other. Accordingly, a logic element 10 results which corresponds to the Boolean function XOR.

The proposed logic element 10 can function nearly without current, since, at least substantially, no more than electric voltages but no (relevant) electric currents are necessary for the writing and entry process. The reading process merely consists of a resistance measurement and can likewise be performed at minimal currents. Another aspect consists in the non-volatility of the logic state, which is stable at the normal reading temperature—particularly room temperature. Moreover, due to its very similar layer structure, the proposed logic element 10 according to the second embodiment can also be combined very easily with the element 10 according to the first embodiment, i.e. with memory elements 10 or a RAM (random access memory).

The invention claimed is:

1. A magnetoresistive element, with a first contact and a second contact, wherein the first contact comprises ferromagnetic material, wherein a first layer made of magnetoelectric or ferroelectric material is allocated to the first contact and designed such that the first contact is magnetically polarized depending on an antiferromagnetic boundary surface polarization of the first layer, with the antiferromagnetic boundary surface polarization being one of controllable or settable through an electric field.

2. The element as set forth in claim 1, the second contact has a defined magnetic polarization, so that the first contact can be magnetically polarized parallel or antiparallel to the magnetic polarization of the second contact depending on the antiferromagnetic boundary surface polarization of the first layer, and/or wherein the second contact is constructed from ferromagnetic material.

3. The element as set forth in claim 1, wherein a second layer is allocated to the second contact in order to set the magnetic polarization of the second contact.

4. The element as set forth in claim 3, wherein the second layer is constructed from permanently magnetic or antiferromagnetic material and, particularly, forms a pad electrode.

5. The element as set forth in claim 3, wherein the second layer is permanently magnetic and its magnetic field (H) has an effect up to the first layer in order to be able to set or vary the antiferromagnetic boundary surface polarization of the first layer depending on an electric field (E).

6. The element as set forth in claim 3, wherein the second layer is constructed from magnetoelectric or ferroelectric material, particularly with the magnetic polarizations of the first and second contact being settable independently of each other by means of the first and second layer.

7. The element as set forth in claim 1, wherein a separating layer is disposed between the first contact and the second contact.

8. The element as set forth in claim 7, wherein the separating layer is constructed from electrically insulating material and/or from non-magnetic material, particularly semiconductor material.

9. The element as set forth in claim 1, wherein the element is a memory element or a logic element.

10. The element as set forth in claim 1, wherein the controlling or setting is done at least substantially without current.

11. The element of claim 1, wherein the antiferromagnetic boundary surface polarizations of the layer can each be set or controlled by an electric field in order to set or control the magnetic polarizations of the contacts and hence make an at least substantially currentless writing of information or setting of states possible.

12. The element as set forth in claim 11, wherein the element is a memory or an integrated circuit.

13. The element as set forth in claim 12, wherein the memory is nonvolatile.

14. A method for the at least substantially currentless writing of information to an element with a ferromagnetic contact and with an allocated, magnetoelectric or ferromagnetic layer, wherein the contact is polarized through an antiferromagnetic boundary surface polarization of the layer, hence forming a piece of magnetic information, with the antiferromagnetic boundary surface polarization of the layer being set or controlled by an electric field (E) at least substantially without current.

15. The method of claim 14, wherein the element is a magnetoresistive element and the information is nonvolatile.

16. The method as set forth in claim 14, wherein for the antiferromagnetic boundary surface polarization of the layer, the same direction of the magnetic field is always used independently of the direction of the desired antiferromagnetic boundary surface polarization of the layer or of the information and, particularly, the antiferromagnetic boundary surface polarization or information depends on the respective direction of the electric field, namely parallel or antiparallel to the magnetic field.

17. The method as set forth in claim 14, wherein, during writing, the same magnetic field (H) is always used and/or wherein the magnetic field is produced by means of a permanent magnet.

18. The method as set forth in claim 14, wherein the maximum field intensity of the magnetic field is produced in a first area of the layer and the maximum field intensity of the electric field is produced in a second area of the layer spaced apart from the first, so that it is only in an overlapping area of the magnetic field and the electric field that the product of the field intensities of the two fields exceeds a minimum value required for writing.

19. A method for writing information to an element with a ferromagnetic contact and with an allocated, magnetoelectric or ferromagnetic layer, wherein the layer is heated above a critical temperature and antiferromagnetically polarized toward the contact by means of a magnetic field and an electric field in a boundary layer on the boundary surface, wherein the magnetic field and the electric field are maintained until cooling to below the critical temperature and/or until freezing of the antiferromagnetic boundary surface polarization of the layer determined by the magnetic field and electric field, and wherein the antiferromagnetic boundary surface polarization of the layer magnetically polarizes the contact and this magnetic polarization of the contact forms information.

20. The method as set forth in claim 19, wherein the heating occurs only locally or in areas and/or that the heating occurs by means of light, particularly laser light.

21. The method as set forth in claim 19, wherein for the antiferromagnetic boundary surface polarization of the layer, the same direction of the magnetic field is always used independently of the direction of the desired antiferromagnetic boundary surface polarization of the layer or of the information and, particularly, the antiferromagnetic boundary surface polarization or information depends on the respective direction of the electric field, namely parallel or antiparallel to the magnetic field.

22. The method as set forth in claim 19, wherein, during writing, the same magnetic field (H) is always used and/or wherein the magnetic field is produced by means of a permanent magnet.

23. The method as set forth in claim 19, wherein the maximum field intensity of the magnetic field is produced in a first area of the layer and the maximum field intensity of the electric field is produced in a second area of the layer spaced apart from the first, so that it is only in an overlapping area of the magnetic field and the electric field that the product of the field intensities of the two fields exceeds a minimum value required for writing.

24. A method of operating an exchange bias system made of ferromagnetic material and of magnetoelectric or ferroelectric material for the storage of information, wherein the magnetic polarization of the ferromagnetic material represents definite information without an outer field, said information being determined by an antiferromagnetic boundary surface polarization of the magnetoelectric or ferroelectric material which, in turn, is determined or set by an electric field at least substantially without current.

* * * * *

UNITED STATES PATENT AND TRADEMARK OFFICE
CERTIFICATE OF CORRECTION

PATENT NO. : 7,719,883 B2 Page 1 of 1
APPLICATION NO. : 11/909854
DATED : May 18, 2010
INVENTOR(S) : Hochstrat et al.

It is certified that error appears in the above-identified patent and that said Letters Patent is hereby corrected as shown below:

On the cover page:

Item (73) Assignee, delete "Duisburh-Essen" and insert -- Duisburg-Essen -- therein.

Signed and Sealed this

Sixth Day of July, 2010

David J. Kappos
*Director of the United States Patent and Trademark Office*